United States Patent [19]

Swainson et al.

[11] 4,333,165

[45] Jun. 1, 1982

[54] THREE-DIMENSIONAL PATTERN MAKING METHODS

[75] Inventors: Wyn K. Swainson, Berkeley; Stephen D. Kramer, Oakland, both of Calif.

[73] Assignee: Formigraphic Engine Corporation, San Francisco, Calif.

[21] Appl. No.: 856,434

[22] Filed: Dec. 1, 1977

Related U.S. Application Data

[63] Continuation-in-part of Ser. No. 544,480, Jan. 27, 1975, Pat. No. 4,078,229.

[51] Int. Cl.³ .................. G11C 11/42; G11C 13/04
[52] U.S. Cl. .................. 365/120; 365/119; 365/127
[58] Field of Search ............... 365/119, 120, 127, 153

[56] References Cited

U.S. PATENT DOCUMENTS

| | | |
|---|---|---|
| 3,296,594 | 1/1967 | Van Heerden ................ 365/127 |
| 3,715,734 | 2/1973 | Fatjans ........................ 365/127 |
| 3,868,655 | 2/1975 | Filippazzi ..................... 365/127 |
| 4,183,094 | 1/1980 | Keezer et al. ................. 365/127 |

Primary Examiner—Terrell W. Fears
Attorney, Agent, or Firm—Stephen S. Townsend; Charles E. Townsend, Jr.; Kenneth R. Allen

[57] ABSTRACT

Method and active media for controlled production of physical and refractive index inhomogeneities in a volume of a suspension medium by use of at least two intersecting beams of electromagnetic radiation matched to the excited state properties of molecules in the media. In addition, complex three-dimensional physical and chemical structures are produced by selective excitation of different types of molecules in the media and by employing transportive capabilities of liquid or gaseous support medium.

27 Claims, 9 Drawing Figures

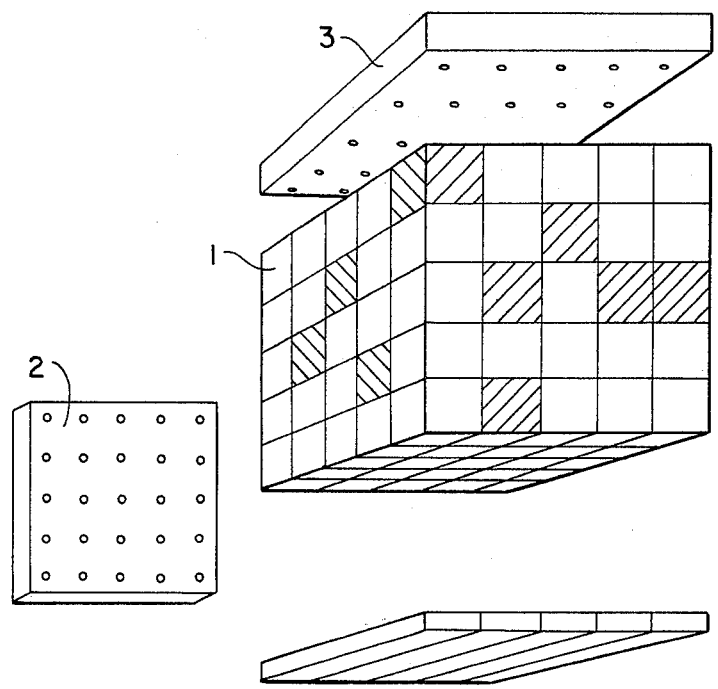
FIG._1.
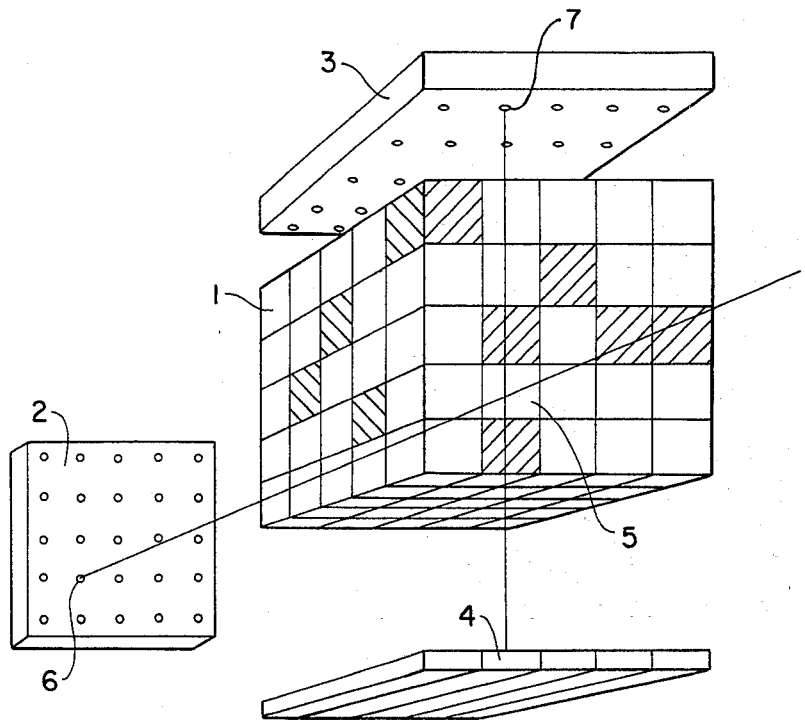
FIG._2.

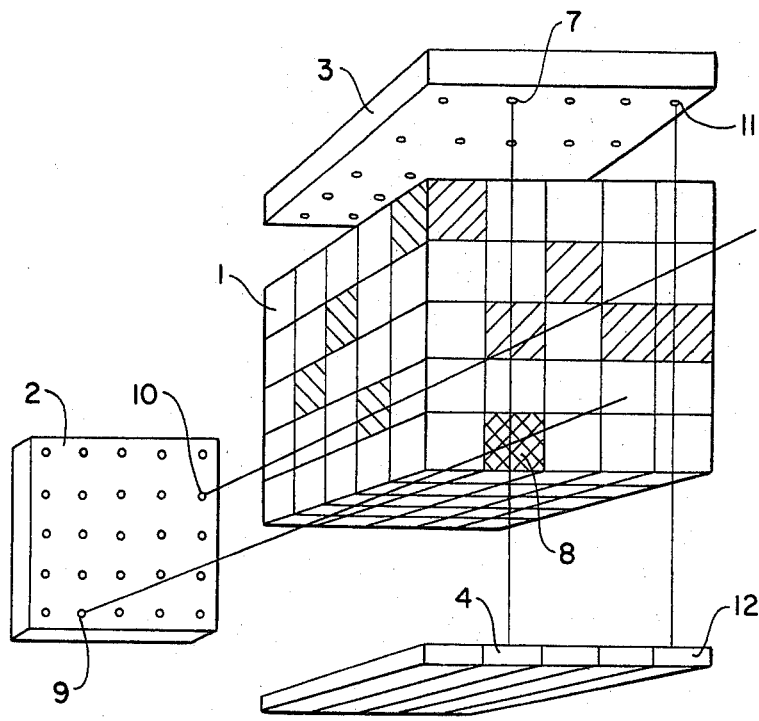
FIG._3.
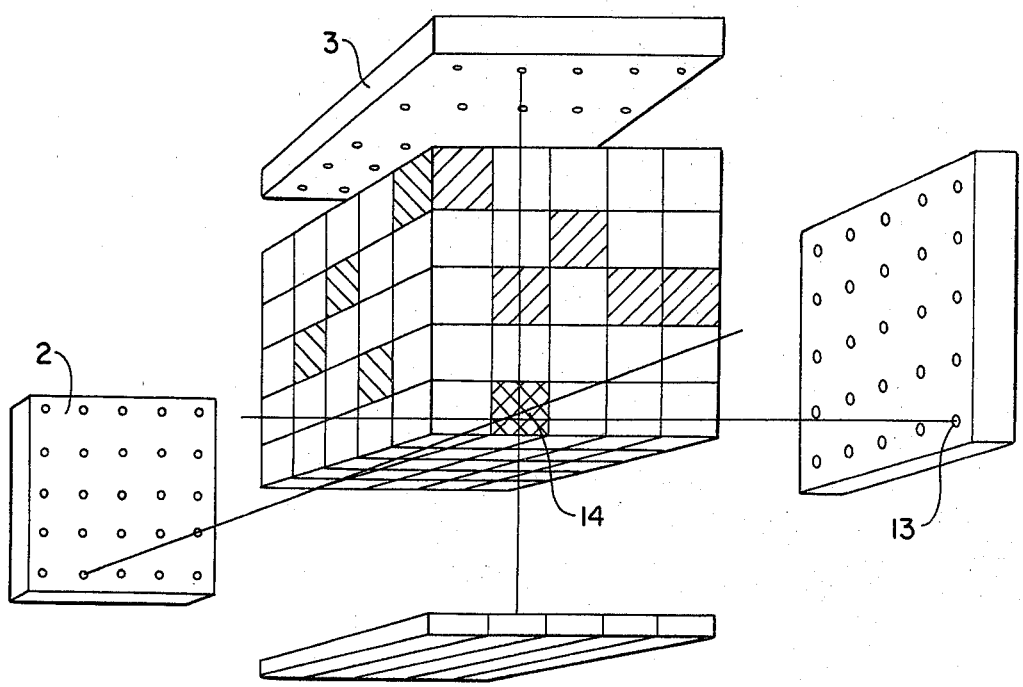
FIG._4.

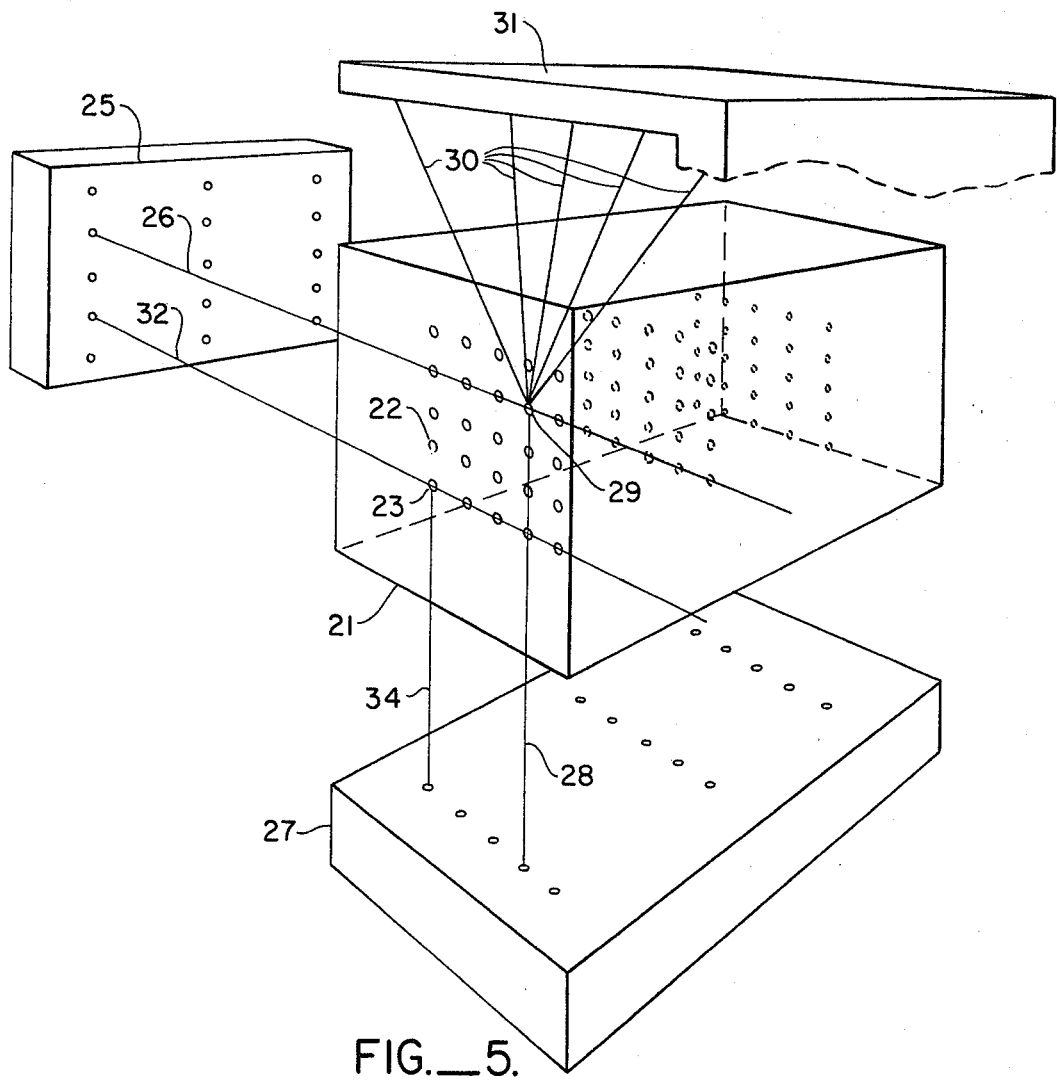
FIG._5.
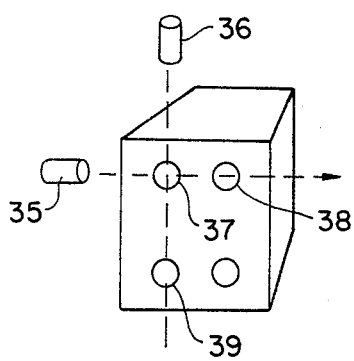
FIG._6.
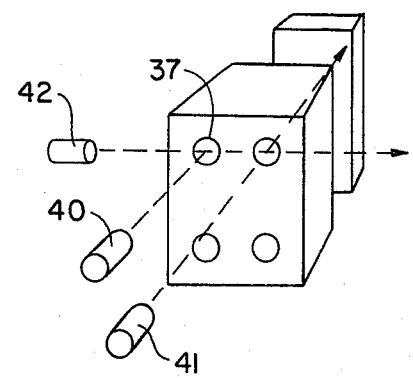
FIG._7.

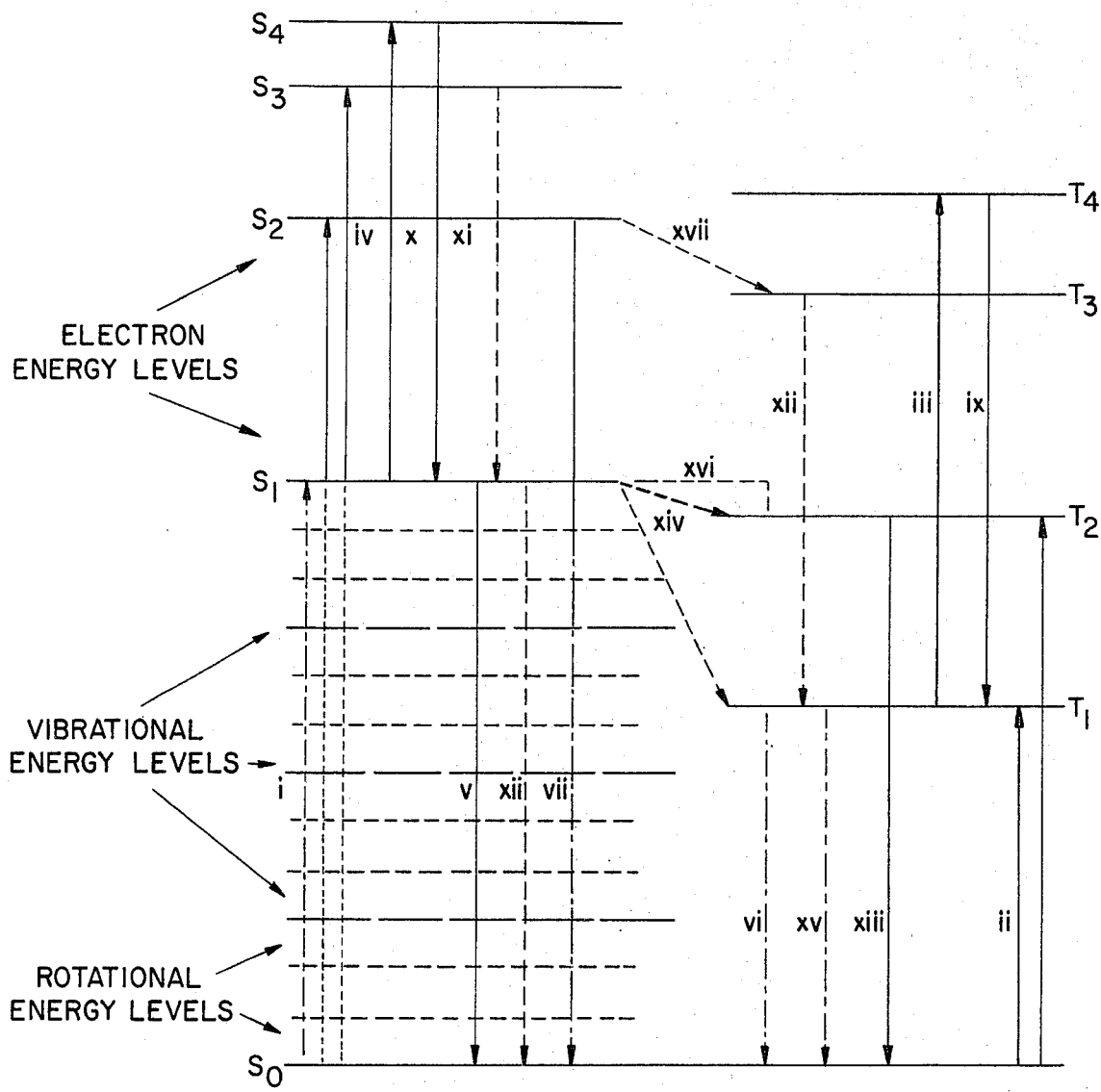
FIG.__8.
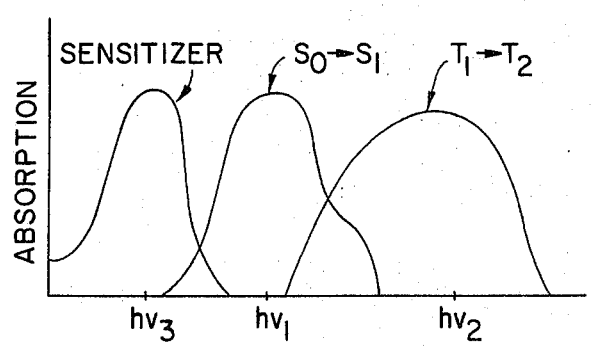
FIG.__9.

THREE-DIMENSIONAL PATTERN MAKING METHODS

REFERENCE TO RELATED APPLICATION

This application is a continuation-in-part application of U.S. application Ser. No. 544,480, filed Jan. 27, 1975, now U.S. Pat. No. 4,078,229 issued Mar. 7, 1978.

REFERENCE TO RELATED DOCUMENTS

The present application includes material submitted by the co-inventors Stephen Kramer and Wyn K. Swainson to the disclosure document program. It is requested that these disclosures be made a part of the application. The numbers and dates of record are as follows:

Disclosure No. 8952 stamped Feb. 10, 1972
Disclosure No. 14716 stamped Nov. 9, 1975
Disclosure No. 16341 stamped Jan. 29, 1975
Disclosure No. 19429 stamped May 21, 1973
Disclosure No. (unknown); Registered mail receipt addressed to the Commissioner of Patents with the date of June 18, 1974.
Disclosure No. 37615 stamped Dec. 30, 1974.

BACKGROUND OF THE INVENTION

1. Field of Invention

The present invention is directed toward improved methods and media for use in production of true three-dimensional sensible objects in apparatus utilising the combined effect of at least two intersecting beams of radiation to form an active region within the volume of a support medium, which active region is manipulated to shape a desired three-dimensional sensible object.

2. Description of the Prior Art

Known media for this purpose have been described in U.S. Pat. Nos. 3,609,706 and 3,609,707 and 4,041,476. These patents are incorporated herein by reference. Part of the last named application appears as British Pat. No. 1,243,043.

In general the known media may require a substantial period of time for use in the construction of extensive or elaborate shapes, sometimes there is undesirable sensitivity or residual sensitivity to one or more of the activating beams, which restricts use to construction of certain simple shapes.

In the above mentioned U.S. Pat. No. 4,041,476 media suitable for use in the invention are grouped into two classes. These classes describe the relationship between the constructing beams and the elements of the medium which form the active region in response to the combined effect of the at least two beams. It may be noted that the two classes relate to the micro-scale of the reactive systems and are not descriptive of the manner in which the constructing beams are manipulated. Manipulation of the beams may be identical whichever class is used.

Class I systems are those in which the effect of the two beams in generating the active region occurs through their simultaneous action. For example, two components may be incorporated within the medium which are both light sensitive but to different spectral regions. By intersecting in the volume two beams of corresponding wavelength each will produce its light-produce in parallel reactions and the two products simultaneously present in the given region will react to form the desired sensible object. When one or both of the products undergoes rapid reverse reaction (as is desirable in order to avoid interference effects) no sensible object will be generated where the two beams are not simultaneously present.

Class II systems differ from the former in that the medium in the first instance contains only a single reactive component which must be stimulated by a first of at least two beams (designated the primary beam), to thereby generate a second component which is sensitive to the second or secondary beam. By this sequential process Class II media provide the active region which generates the sensible object. Additive systems such as shown in Example 3 of U.S. Pat. No. 4,041,476 in which the beams are identical have characteristics common to both Class I and Class II, in that they work by the cumulative effect of both simultaneous and sequential reactions. In this case the products of reaction in the active region accumulate at a rate greater than the rate of accumulation in other regions or individual beam paths. Such systems can be successfully used with an effectively infinite number of intersection beams produced by a lens focus or many individual beams, but they are inferior to other systems.

SUMMARY OF THE INVENTION

In the present application, method and active media are disclosed for controlled production of physical or refractive index inhomogenities in a volume of a suspension medium which may be a solid, a stabilized medium such as a gelatin, a liquid or a gas. According to the method of the invention at least two intersecting beams of electromagnetic radiation having characteristics selectively matched to the excited state properties of molecules in the active media generate the desired inhomogeneities. In particular embodiments, complex physical and chemical structures are progressively constructed by selective excitation of different types of molecules of the active media and by use of the transportive capabilities of a liquid or gaseous suspension medium.

Active media for use in the invention are divided into two corresponding classes. Class I media respond to the simultaneous effect of one photon from each of the constructing electromagnetic radiation beams to form the activated or "active" region, while Class II systems require that a photon from one of the beams act on a component of the medium before the medium will be responsive to the effect of the other beam. In this case the medium is sequentially responsive first to the primary beam and then to the secondary beam. Some of the active media can be used in several modes depending on the particular parameters of the beams used. For example if the absorption spectra of the first component of the previously known Class II system is similar to the modified component after exposure to the primary photon, and the beams are of similar wavelength, then the effect will be simply additive in the region of intersection. On the other hand, if the spectra of absorption are different and different wavelength beams corresponding to the individual peak absorption regions are used, then a synergistic effect is obtained and the active region will be maximally differentiated from the rest of the medium. This is not the case, however, with the Class II systems of the present invention, in which a synergistic effect is obtained under either of the above conditions, but it will be potentially greater using different wavelengths and corresponding elements with selective absorption. Systems have been generally classified and described according to that mode of use which provides the maximum effect in the active region and a minimum of spurious effect in non-image areas.

In addition to those elements which play a direct role in generating the active region the medium will contain other material such as dispersive agents, matrix polymers, glasses, gels, liquid or gaseous components, etc. within the reactions will occur and which are transmissive of the radiations used. Examples of such other material will be found throughout the examples of the following pages.

Another objective is to provide media in which the sensible object product comprises regions with altered refractive index forming integrated lens regions within the medium volume which may also be incorporated into three-dimensional optional circuits.

A sixth object is to provide media within which there may be produced patterns of altered condition capable of being used as the components of a three-dimensional optical computer memory in which data registration and readout of data can be accomplished by use of collimated or focussed beams.

A seventh object is to provide media within which the above mentioned memory elements may be combined with three-dimensional optical circuitry to form a computer memory matrix.

An eighth object is to provide a means by which any known photoreactive material may be employed as a two stage photoreactive element as described in U.S. Pat. No. 4,041,476 by suitable selection of activating beams and energy levels.

Additional objects are disclosed in the following specification.

One of the accomplishments of the present invention is to provide a means whereby two beams of identical wavelength can be used to generate a non-additive but synergistic effect providing many of the advantages of previously known systems which require use of beams with different wavelength. A similar improvement is made by the present invention for those cases where different different wavelengths are used but the active region generating elements has substantially equivalent absorption and reaction to the two wavelengths.

Among the other applications to which the media of the present invention lend themselves one important use is in the construction of three-dimensional optical circuitry. For example, by using materials in which the refractive index is altered in the medium by the action of intersecting beams, one can construct actual lenses within a suitable volume of material. Also, it becomes possible to construct complex optical circuits in a similar fashion in three-dimensions. Known optical circuits are confined to plane surfaces, as described in the article by S. E. Miller. *Bell System Technical Journal*, Sept. 1969, page 2059 or *Science*, Nov. 13, 1970, page 694. Suitable materials have been described for the purpose of making thick holograms in articles by M. R. B. Forshaw, *Optics and Laser Technology*, Feb. 1974, page 28, and by Bowden, Chandross and Kaminow in *Polymer Engineering and Science*, July 1974, Vol. 14, No. 7, page 494. By matching the constructing beams to the properties of these materials and catalysts one can construct with two beams of different energy combining to form the active region without significant attenuation and with great speed. Use of the medium in the process of this invention converts the conventionally single stage photoresponse mechanism (reactive for example to beam A) to the two-stage mechanism described in pending application Ser. No. 165,042 (requiring the combined effect of two different beams B and C).

Other materials which exhibit refractive index changes have been described by J. A. Jenny, Journal of the Optical Society of America, Vol. 60, Sept. 1970, p. 1155. With two-stage media based on such compositions an independent radiation can be used to activate a stabilising component such as p-toluene sulphinic acid to prevent further change.

Most of the above mentioned compositions undergo refractive index change as a gradient through monomer-polymer-copolymer-crosslinked polymer. Alternatively photochromics such as described by Tomlinson, et. al. at Bell Telephone Laboratories (Spring meeting, 1973, Optical Society of America) are available which exhibit significant differences in refractive index with respect to wavelengths not absorbed by either phase of the photochromic.

Another improvement of the present invention over the prior art lies in the technique applied to certain media in which the shape of the intersection is controlled so that only one point or surface of the intersection region is placed being generated, while the remaining portion of the region of intersection is kept either within or without the locus of the surface of an object to be shaped. In this way the locus of the surface can be more accurately defined (the tangent point is effectively manipulated in the same way as a conventional machine tool cutting edge), and instead of obtaining a thin shell of sensible object, the body of the "light tool" will create a substantial body of material altered by the active region. The actual shape and size wil be determined by the controlled shape of the intersection and the technique is of particular value when a separable object is to be prepared.

Another important application to which the new media lend themselves is in the construction of three-dimensional optical computer memories. Such media may include optical circuit elements as described above, and may incorporate the energy transfer and photochromic dyes described elsewhere in this specification. The following description of simple examples of such volume memories is not meant to be confining, but will demonstrate basic principles of operation for such a memory.

The prior art has disclosed a variety of optical memory devices, such as the article of Stephen Herman presented at the Symposium on Modern Optics, Polytechnic Institute of Brooklyn, Mar. 1967, and reprinted in *Modern Optics*. All of such devices have been two-dimensional arrays with the exception of that described by Geller in U.S. Pat. No. 3,654,626. The advantage of the present invention over two-dimensional arrays in terms of information capacity alone is obvious. Geller's memory is in three-dimensions, but lacking the use of two-stage photoreactions he is confined to use of a focus beam for all functions. This is particularly disadvantageous in readout, and the presently described technique is a significant improvement.

Other advantages of three-dimensional computer display using the present invention include provision of data density up to $10^{12}$ bits per cubic centimeter, of particular advantage for language translation, character recognition, machine control, and other uses for which a high density fixed memory is suitable. Another advantage is the provision of optical interconnection of digital elements in which signal connection between parts of the system is possible without the need for electrical or physical contacts. Further, the invention gives nondestructive readout capable of parallel operations and in which signal isolation allows unsynchronized operation of write/erase and read modes with random access write and simultaneous associative search.

OBJECTS, PURPOSES, ADVANTAGES & APPLICATIONS OF THE INVENTION

It is the purpose of this invention to provide improved media in which registration of the active region within the medium is very rapid, down to the microsecond or picosecond range.

Another object is to provide media in which the attenuation of the beams in passage through the medium to the site of the active region is very much reduced and for practical purposes eliminated.

A third objective is to provide media suitable for production of large-scale sensible objects.

A fourth objective is to provide media with improved resolution capabilities.

BRIEF DESCRIPTION OF THE FORMAL DRAWINGS

The invention will be better understood by reference to the following detailed description of the accompanying figures numbered 1 through 7.

FIG. 1 is a illustrative of elements of the invention.

FIGS. 2–5 show operation according to the invention.

FIGS. 6 and 7 illustrate an alternative embodiment of the invention.

FIG. 8 illustrates the unimolecular photo physical process states utilized in the practice of the invention.

FIG. 9 illustrates absorption spectra utilized in the invention.

DESCRIPTION OF THE PREFERRED EMBODIMENTS

FIG. 1 is an embodiment of the invention composed of individually assembled 1 cm.$^3$ blocks of photochromic glass (representing +bits, for example) with non-photochromic blanks of glass (−bits). Photochromic is used in the sense of capacity to switch between different absorptive conditions, not necessarily confined to the visible region and also encompassing the capacity for altered absorption exhibited by excited state molecules as described elsewhere in this specification.

Programming this simple fixed memory is accomplished during assembly placing a photochromic cube in positions representing a (+) bit, while blanks are used to occupy positions of (−) bits. In FIG. 1 individually addressable portions number 125 ($5^3$), which are accessable through operation of the digital light beam deflectors 2 and 3, located at the bottom and side of the memory array. At the rear of the assembly is a photodetector cell 4, used in the reading operation. Instead of a digital deflector system, individual semiconductor lasers can be used.

In operation of the device shown in FIG. 1 beam source 2 will provide a wavelength beam selected to interact closely with the coloring wavelength of the photochromic element which beam source 3 will be selected to be strongly absorbed by the colored form generated in the sensitive cubes by absorption of beam 2.

FIGS. 2 and 3 show the operation of the above device. In drawing 2 the cell selected for reading is marked 5, and in the process of reading it is penetrated from beam source 6 matched to the coloring wavelength of the incorporated photochromic. In this case cell 5 contains no photochromic and in consequency beam 7 penetrates without absorption and registration on photodetector 4 indicates (−) bit. With photochromics having two stable states, the memory may be additionally subjected to appropriate heat or radiation to maintain the desired state in dominance except where overriden by beams in the reading operation. With the excited state media of the present invention such additional radiation is not needed and the rapid return to ground state allows very high reading rates.

In FIG. 3 a similar operation is carried out with a (+) bit in the position of interest and the photodetector has been subdivided to permit simultaneous operation in the different corridors of information. In more sophisticated versions light guides can be constructed through regions of altered refractive index as described above. Such systems are comparable to some optical memories utilizing fiber optics and provides considerable improvements over manual fabrication methods as well as much improved volume capacity.

In FIG. 4 an additional directed beam 13 has been to return the cell 14 to the non-absorptive condition following reading. Beam 13 will be controlled by a circuit preventing activation in any column which at the same time contains a cell undergoing the interrogation-reading operation.

Choice of proper light detectors is important to take full advantage of the rapid response time of the absorptive/non-absorptive elements of the memory. This may be as little as $\frac{1}{2}$ to 10 microseconds, or better. Reverse biased p-n junction solid state detectors give near unity gain or better with the avalanche-type, but frequency response is confined to the 10–100 MHz region and area of surface on the order of tens of mils are required.

Where the GaAs tunnel diode is used in one of the transmission-impingement memories as described above, the emitting peak conveniently matches the high efficiency detection band of both the S-1 multiplier and the silicon photodetector. All three devices are capable of speeds in the nano-second range so that the limiting factor in the speed of the memory using these devices lies within the two-stage photoreactive or emissive system itself. In this respect it is important to note that the sensitivities of the electronic devices allow response to an absorption alteration far less than would be required for human perception. Internal conversions often take place in less that $10^{-8}$ second which means that the primary process in the photoproduction of of a metastable species often occurs in about a millimicrosecond ($10^{-9}$ sec.).

This last is an important factor to allow for in the design of memories and the other applications of the present invention. It controls the time available for the secondary reaction before spontaneous decay. For example, in photochromic reduction-oxidation systems in which no electron migration or stabilization can occur after excitation, the electron returns to its ground state through either luminescence of radiationless transition. Since most charge transfer transitions occur with high probability, the excited state persists for only about $10^{-8}$ seconds. Therefore the secondary process must be very fast to compete with spontaneous return. In this case the donor or acceptor component of the redox system need not be confined to independent atoms, ions, or molecules. Alkali halide color centers are such acceptor systems comprising imperfections in crystal lattice capable of functioning as electron traps.

For transmission-impingement with the GaAs tunnel diode the vacuum detector (photo-emitter) suffers from a quantum efficiency of less than 1% at 0.9 microns falling off at the rate of about 20 dB per 1000 Å. However for combinations of devices lasing in regions of higher efficiency with suitable deflectors they are more satisfactory and there is the advantage of direct high-impedance coupling to the electron multiplier amplifier permitting an enormous gain-bandwidth product. These devices are also desireable in that excellent cycle times in the nano-second range permit high bit rates.

Obtaining high quantum gain in the memory is usually important and the best developed device is the electron multiplier with the laser amplifier, modulator gain, and avalanche detector gain offering large development potential. The electron multiplier plus light diode technique offer bit rates and channel densities on the order of 100 MHz and 4 per cm.$^2$, respectively.

While the mechanically assembled fixed memory described about gives an idea of the working of the invention, the most valuable adaptations use media in which the local regions of memory store are generated in situ through the combined effect of intersecting beams. In one such version the analogue of the above transmission-impingement memory can be constructed through localised activation or poisoning of a homogenously distributed photochromic. For example the spyropyrans of British Pat. No. 935,186 are photochromic only in solution and can be activated by localised solution through depolymerisation in the Oster-based media of U.S. Pat. No. 4,041,476. Similarly behaved are the anthrones of British Pat. No. 873,380. A large number of photochromic materials are known in the literature to be inactivated by minute amounts of materials which can be photo-generated by the method of this invention.

FIG. 5 shows another type of volume memory based on media of the present invention. The matrix 21 is composed of material capable of fluorescence under appropriate stimulation. Beam sources 25 and 27 provide intersecting beams of dissimilar radiation 26 and 28, selected according to the sensitivity of 25 and 27 to particular wavelengths. The memory has been previously programmed through poisoning of the fluorescence capacity in selected bit locations (23), while leaving this capacity in other areas intact (22,29).

Operation of this radiation-emissive memory is carried out by simultaneous or sequential stimulation of the selected bit location with beams 26 and 28 (for practical purposes the sequential stimulation will be simultaneous). Depending on the particular mechanism involved, one beam raises the electron excitation level to a first excited state from which spontaneous decay is non-radiation emitting, while the second beam acts on these excited state molecules to raise them to a subsequent excited state, from which decay produces fluorescence on return to the ground state. In this simple apparatus each such event is recorded by surrounding photodetectors 31 and through synchronised timing can be read as a (+) bit in the selected cell. For more rapid operation or simultaneous multiple reading the volume will be sectioned by use of optical circuitry and light guides generated through control of refractive index as described above.

Another variation is shown in FIGS. 6 and 7. Here for clarity only one section of the medium is shown with only four positions or cells. This memory is programmed as in FIG. 5 by the action of the intersecting beams 35 and 36 acting in combination to generate at position 37 a spot of colored fluorescent dye representing the (+) state. Position 38 will be left undyed through absence of beam 36 while position 39 will be left undyed in absence of beam 35. This memory system incorporates an auxilliary photochromic compound specifically responsive (coloring) to the fluorescence wavelength of the dye formed in the programming operation above, but insensitive to any of the other wavelengths used on the material. Use of this secondary photochromic for actual blocking/un-blocking (corresponding to +/−bits) of the reading beams 40 and 41 allows selection of the plane of interest by beam 42 and permits penetration of 40 and 41 through (+) bits in other planes.

Beam source 42 generates a beam of a wavelength strongly absorbed by the fluorescent dye present in the programmed (+) positions but to which the medium is otherwise transparent. The fluorescent dye re-emits on a wavelength causing the incorporated photochromic to color in the (+) positions so that the new photochromic coloration is superimposed on the dye coloration. This secondary absorption is different from the fluorescent dye and is selected so as to be opaque to the identical intersecting beams 40 and 41. Drawing 6 shows the effect of a (+) state in position 37. The beam from 40 is blocked by the photochromic-induced secondary absorption. The alternative effect of a (−) bit is shown in the case of beam 41, where the absence of a fluorescent dye results in no absorption of beam 40 and in consequence no secondary absorption of beam 41 since the photochromic remains uncolored. Absence of a (+) and presence of a (−) bit at the intersection of beams 40 and 42 is registered by the photodetector shown in drawing 6, which registers the successful penetration of beam 42. Reprogrammable systems of this kind are obtained by replacing the fluorescent dye system with a photo-reversible dye system such as described in this specification.

Class I Systems

The known Class I systems utilising the simultaneous absorption of two photons have been compounded with two separate photoreactive components, each of which absorbs a photon to produce a product. The two products then interact to generate the figure. To maximise the differentiation of the active region different wavelengths are used and they are matched to the peak absorption regions of the individual components. These media react as in Formula 1;

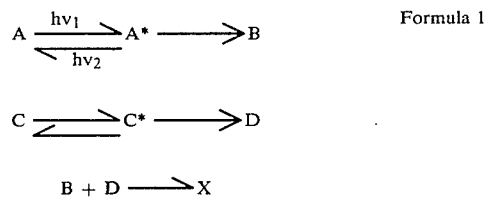

Formula 1

Here an original component (A) on absorbing photon $h\nu_1$ from beam one generates an excited state (A*), forming reaction product B. Another original component (C) on absorbing photon $h\nu_2$ from the second beam produces excited state (C*), resulting in product (D). Products (B) and (D) combine within the medium to form the figure element (X), which may be a dye or other effect desired.

The main disadvantage of these known systems is that in order to produce the active region multimolecular interaction takes place, necessitating the migration of elements within the medium before the active region is formed. In solid or viscous media this may be undesirably slow.

In the present invention use is made of a new kind of Class I media, in which the two photons from the individual beams are simultaneously absorbed in a single molecule so that no migration is required to generate the active region. They are diagrammed thus;

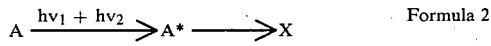
$$A \xrightarrow{h\nu_1 + h\nu_2} A^* \longrightarrow X \qquad \text{Formula 2}$$

In these media the active region is generated wherein the single molecule (A) absorbs simultaneously one photon from each of the two beams ($h\nu_1$ and $h\nu_2$), producing the excited state (A*) and then (X). Once the active region has formed there may be migration of elements, for example in catalyzed reactions or other effects, but no migration is required for the generation of the active region itself.

In the following specification those older Class I systems which require migration of elements in the production of the active region are designated Class I Group 1 systems. The Class I systems of the present invention which require no migration are designated Class I Group 2 systems.

Class II Systems

Class II media are distinguished from the first class of media in that on the micro-scale the reactions forming the active region require the sequential action of photons from the two beams. In these compositions the original medium contains only the photosensitive element which when stimulated by the primary beam photon generates an intermediate product which absorbs the secondary beam, forming the active region. Most known Class II systems are also multimolecular and require migration of elements for formation of the active region. An example is No. 4 in the table of U.S. Pat. No. 4,041,476 in which the acid catalyst generated by the primary beam must interact with other reactions (O.R.). Since the product of this reaction is relatively stable the reactions are best diagrammed as follows;

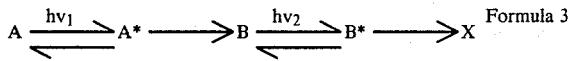
$$A \xrightarrow{h\nu_1} A^* \longrightarrow B \xrightarrow{h\nu_2} B^* \longrightarrow X \qquad \text{Formula 3}$$

In this case component A absorbs the photon form the primary beam $h\nu_1$ to generate the excited state A*, which results in the new stable component (B). The intermediate (B) absorbs photon $h\nu_2$ generating the active region (in the table, No. 4 is characterised by elevated temperature and chemical change) which produces (X).

New Class II media of the above kind are discussed in the following pages under the classification of Class II Group 2 media. Those compositions overcome problems of migration by use of single molecule reaction, but those in which there is no rapid reverse reaction from (B) to (A) have the disadvantage that interference between beam two and the beam-path traces of beam one limit their use to certain simple figures.

Much more useful compositions of Group 2, Class II are those in which there is a reverse reaction from (B) to (A) as shown in Formula 24. Such media have been prepared using photochromic materials and one form of use has been described in U.S. Pat. No. 4,041,476 Example 2. A different form of use is described in Table 1 of the same application as numbers 20 and 21. In the latter case in order to avoid interference effects photochromics with a rapid reverse reaction from (B) to (A) will be used and it may be necessary to employ additional heat or radiation to speed that reverse reaction.

The present invention discloses a much wider range of materials with monomolecular reaction to photons and spontaneous reverse reaction from (B) to (A) which are useful in the same mode as Table numbers 20 and 21 above. These new materials may not have the property of visible color change to the eye, but instead the change of absorption produced by the primary beam will be matched to the wavelength of the secondary beam, which may be in the nonvisible portions of the spectrum. Depending on the mode of use photochromic materials of this kind may also be classified as Class II Group 1 media, as described below.

The present invention discloses a new group of Class II media in which are reverse reaction from B to A may take place in the micro-, pico-, or nano-second range. The new materials are all monomolecular in nature and the active region is generated without the necessity for migration. The media reactions can be diagrammed thus;

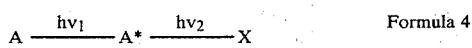
$$A \xrightarrow{h\nu_1} A^* \xrightarrow{h\nu_2} X \qquad \text{Formula 4}$$

In these systems component (A) absorbs photon $h\nu_1$ to generate (A*), which during it's excited period has enhanced absorption of $h\nu_2$. Absorption of $h\nu_2$ produces the active region which can have a variety of characteristics. It may be raised in temperature, it may enter into a process of energy transfer or it may result in the liberation of free radicals. Other effects which may characterize the active region are discussed in the following pages.

The following nomenclature is used.

$V_1$ is the primary beam.

$V_2$ is the secondary beam.

$1_A$ shows a molecule in ground state ($S_0$).

$1_{Av/r}$ shows a molecule in a higher vibrational/rotational level of ground state manifold.

$1_A{}^*$ shows a molecule in $S_1$ (excited singlet manifold)

$1_A{}^{**}$ shows a molecule in $S_p$ (higher excited singlet manifold)

$3_A{}^*$ shows a molecule in $T_1$ (excited triplet manifold)

$3_A{}^{**}$ shows a molecule in $T_q$ (higher excited triplet manifold)

X shows radical, ion, colored product, luminescence, or other desired figure element.

The media of the present invention exploit the principles of two-photon excitation of single molecules for the production of three-dimensional sensible objects within a volume of medium by manipulation of at least two intersecting beams of radiation as set forth below.

A brief description of the physical principles involved follows. For additional information consult pages 30–31 of *Photophysics of Aromatic Molecules*, by John B. Birks, published by Wiley-Interscience, New York, 1970, or Chapter 1 of *Organic Photochemistry*, by Robert O. Kan, McGraw-Hill, New York, 1966.

FIG. 8 shows some of the excited intermediate states utilized in the practice of the invention. On the left side of the figure there are shown the several electron energy levels ($S_0$ or ground state), ($S_1$ or first excited state), etc. which together with associated vibrational levels ($V_1$, $V_2$ etc.) and rotational energy levels ($R_1$, $R_2$ etc.) constitute the singlet manifold. In general the higher electron energy levels ($S_1$ etc.) require the input of photon energy comparable to visible light, while the vibrational or rotational energy levels can be achieved using beams at the lower and infra-red end of the spectrum.

On the right side of FIG. 8 there is shown the triplet manifold, made up of the triplet states ($T_1$, $T_2$ etc.) with their associated vibrational levels. Movement between levels is shown with solid lines (radiative transitions) and broken lines (radiationless transitions).

In most photochemical reactions only two half-vacant orbitals are associated with a molecule in the excited state (the orbital from which the transition takes place and the antibonding orbital to which the electron is promoted), and the consequently only two values for the multiplicity are obtained: 1 and 3. The former, in which the spin has been preserved, is called the singlet state, and the latter, in which the spins are parallel, is the triplet state. Most organic molecules in the ground state are singlets. In the practice of this invention both singlet and triplet states are exploited.

Triplet state reactions are often preferred because of the advantages of their longer lifetimes. Most singlet state excitations survive only for periods measured in nanoseconds to microseconds, while triplet lifetimes are measured in microseconds to seconds. These relatively long triplet lifetimes can be selected to match with beam intensities and other factors to permit high-yield reactions, while at the same time avoiding beam interference in non-figure regions while performing rapid construction of the desired sensible objects.

In the present invention the most useful media are of Class I in which simultaneous two-photon absorption occurs and in which there is no intermediate formed, or of Class II, in which sequential two-photon excitation produces an excited state intermediate through action of the primary beam which absorbs the secondary beam, or alternatively, in which the secondary beam absorber may be in the ground state. The invention is set forth in detail in the following section.

Class I; Simultaneous Two-Photon Absorption Systems

Class I, Group 1

No new systems of this group are described here.

Class I, Group 2

Excitation from a ground state to an excited state of a molecule may occur following the simultaneous absorption of two photons. For this to occur, the energy difference between the two states designated E must be equal to or less than twice the frequency of the exciting light $x_1$ but greater than $x$.:$x_1 < E \leq 2x_1$. One focused beam, or unfocused intersecting beams of identical frequencies can be used.

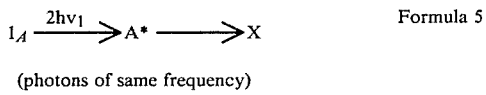

Formula 5

(photons of same frequency)

In this case, although the light beams are of the same frequency, the effect at the intersection is more than simply additive. This synergistic effect is obtained because the yield of (X) is proportional to the square of the light intensity used. This synergism enlarges the usefulness of single-wavelength beams which otherwise generally require the use of many beams at one intersection, or a focus (effectively an infinite number of individual beams) to give a useful image.

Synergistic media with these advantages can be prepared according to these examples.

(1) A frozen glass of 9 grams styrene in a pyrex cell is exposed to a focused, high intensity pulsed ruby laser (peak power about $3 \times 10^5$ W). After twenty pulses, 31 mg. of polymer is formed. Synchronized individual beams may replace the focus beams and be moved to place the regions of generated polymer at desired locations within the volume of styrene. Other monomers, such as p-isopropylstyrene or chlorine substituted styrene derivatives, give greater yields of polymer and the addition of a disfunctional monomer like divinylbenzene will decrease the solubility of the polymer.

(2) A solution of 8' allyl-6' nitro-1, 3, 3-trimethyl-spiro(2' N-1-benzopyran-2'-2-indoline) in benzene is exposed to intersecting synchronised pulsed ruby laser beams (4 J output free lasing mode, pulse length $3 \times 10^{-4}$ sec.) with a UV elimination filter. At the region of intersection a spot of color is formed which fades in about 10 seconds. The same experiment may be repeated using the spiropyran dissolved in a plastic (polymethylmeth-acrylate) in which case the time for fading of the color takes several minutes. This rate of fading can be controlled by altering the temperature. Other photochromics can be used in a similar way.

(3) A transparent matrix incorporating leuco-azure A produces a red color if illuminated as above with beams of high intensity pulsed ruby laser light. Other variations are possible using materials described in the article by Oster, J. American Chemical Society, Vol. 81, p. 5100. Other color generating compounds, such as photochromics of the 2.4-dinitrophenylpyridine type can be used to generate non-permanent moving display images. The speed of the color-fading reaction can be controlled with a $10^5$-fold variation by altering the pH of the system. See Journ. American Chemical Society, Vol. 84, p. 3658.

(4) A viscous solution containing $10^{-2}$ M Eosin Y, $10^{-3}$ p-toluenesulphinic acid, 30% acrylamide, 5% methoenebisacrylamide in ethylene glycol is exposed to a group of high intensity intersecting beams from a ruby laser. Insoluble polymer forms as a white material at the intersection region.

Although the synergistic effect obtained with the above systems of Class I, group 2 is an improvement over the simply additive effect of earlier systems, still better effects can be obtained using at least two beams of different wavelengths, as in Formula 6.

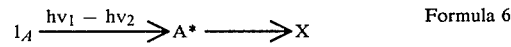

Formula 6

The frequencies of ($h\nu_1$) ($h\nu_2$), are selected to meet the following requirements: $E \leq (h\nu_1) + (h\nu_2)$, and ($h\nu_1$) > ($h\nu_2$), and $E > 2(h\nu_2)$. Under these conditions a very intense beam of wavelength ($h\nu_2$) (in spite of high intensity the probability of three photon absorption remains very low) is intersected with a less intense beam of ($h\nu_1$). This method gives very little two-photon absorption in the beam paths, confining photochemical reaction to the intersection alone. The excited state obtained by this method may form colored products or serve as an energy transfer agent. Where the direct effect is of luminescence, a second component can be present which reacts to the luminescence wavelength but is insensitive to the constructing beams. Thus a transitory luminescence may be used to form the non-radiation emissive sensible object of this invention.

Among other advantages of the above system are the possibility of exposure times in the microsecond or picosecond range, and the elimination of problems of special fixation for the produced object, and prevention of residual traces from the scanning beam.

Examples of Class I, group 2 two-photon absorption systems utilizing different frequencies are as follows.

(1) A cell filled with diphenylcyclopentadiene solution is illuminated with intersecting beams corresponding to wavelengths 9431 cm.$^{-1}$ and 18862 cm.$^{-1}$ ($h\nu_1$ and $h\nu_2$). If desired, a single laser can be used to form the first path through the medium and unabsorbed emission from the far side can be passed through a KPD second harmonic generator crystal (to form $h\nu_2$) and a filter (to remove $h\nu_1$), and then be reflected back on an optical path which will cause it to re-enter the medium from a new point to intersect with the original path. In this example fluorescence occurs at the intersection.

(2) $Cr(CO)_6$ is dissolved in methylmethacrylate containing azoisobutyronitrile and heated at 50° C. until all polymerization is complete. Penetration of this medium by intersecting beams as above results in two-photon abssorption producing an intense yellow color which is stable at 77° K., but which fades in several hours at room temperature.

(3) Barium acrylate is dissolved in a hot solution of gelatin containing methylene blue, p-toluenesulphinic acid and cooled until a gel is formed. Two-photon absorption as above by the methylene blue generates radicals at the beam intersection which polymerizes the barium acrylate, yielding an opaque, light scattering polymer image.

(4) A frozen glass of acrylonitrile, in which is dissolved a large amount of a light activated radical generating compound, such as benzoin or azoisobutyronitrile, is exposed in a similar manner. Two-photon absorption by the catalyst generates radicals which form light scattering insoluble polymer.

(5) A solution of a photo crosslinking agent such as 2-methylanthraquinone or 1-chloroanthraquinone in a suitable monomer such as vinyl acetate, styrene, methyl acrylate, etc., containing a photopolymerization catalyst, whose absorption spectrum is similar to the cross linking agent, is frozen and exposed to two intense beams of light. At the intersection point the monomer is polymerized and crosslinked. After exposure the glass is melted and the exposed areas separated from matrix with or without the use of solvents.

(6) Instead of exposing a frozen glass, gels can be used. A heat activated polymerization catalyst can be added to system 4. The solution is then heated until it gels and then exposed as above. A catalyst, such as azoisobutyronitrile, would be appropriate for this system since it is both heat and light activated. Solvents are used to separate the image from matrix.

(7) A photosensitive polymer capable of being crosslinked by light, with or without sensitizers and additional crosslinking agents such as those in 5, is exposed to two intense beams of light such that two photon absorption occurs at the beam intersection. The crosslinked polymer is then separated from the matrix using solvents. Examples of suitable polymers for this system: polyvinylcinnamate, polyvinylbenzophenone, polymers incorporating diethyldithiocarbamate, anthracene, azides, acylazides, sulphonyl azides, aryldiazides, a-diazoketones, furylacryl and allyl groups, stilbenes, azidocinnamates, polyacetylenes, polymers in which the light sensitive group is attached to a polymeric backbone via isocyanate compounds forming urethanes, certain alkene polymers with sensitizing halogen compounds, polyesters formed from cinnyamylidenemalonic acid and related compounds. Other photosensitive polymers which crosslink via a photodimerization mechanism, or as the result of the photolysis of a photolabile group, either linked or separate from the polymer chain, can be substituted and used in a similar way.

(8) Thiolated gelatine containing riboflavine or similar acting dye is exposed as in example 6. The thiol groups at the intersection region crosslink, rendering the image insoluble.

(9) A mercuric chloride crosslinked gel containing a photo-reducible dye is exposed as in example 6. At the beam intersection region the mercuric ion is reduced, de-crosslinking the gel. This is a negative-working system which could be used to produce a mold.

(10) A clear matrix containing a high concentration of halogenated resin and, if necessary, other halogenated compounds, plus zinc acetate or another chemical which in the presence of halogen form a Friedel Crafts catalyst. This medium when exposed to two intense beams of appropriate frequency will generate the catalyst at the beam intersection to cause polymer degradation and colored compounds. These images can be intensified using heat.

(11) The examples 1 to 4 may also be exposed using two intersecting beams of appropriate frequency and intensity, giving results superior to that which is obtained when two-photons of the same frequency are used.

The systems of Class I, Group 2 are also susceptible to the utilization of sensitized reactions as illustrated in the following Formulas.

  Formula 7

Formula 7 shows absorption of two dissimilar photons by a sensitizer utilizing the singlet-singlet interaction of fluorescence. The following Formulas 8 and 9 show singlet and triplet sensitized reactions.

  Formula 8

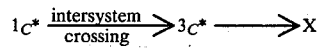

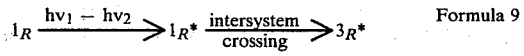  Formula 9

-continued $$3_{R^*} + 1_C \longrightarrow 1_R + 3_{C^*}$$

$$3_{C^*} \longrightarrow X$$

In the above systems and those to follow the product (X) corresponds to generation of the active region or the sensible object portion. In a variation of the method which constitutes an important part of this invention and is applicable to both Class I and II systems, (X) may be an energy transfer agent, such as a stable fluorescent compound, which can receive energy in the form of blanket radiation. This temporary fluorescence serves as a step intermediate for the production of the sensible object of the invention. The advantage of this is that a single fluorescent molecule is capable of transferring more than a thousand photons per second to an acceptor system. Thus, the original effect of the photon or photons used to generate (X) during the scanning process can be amplified greatly, permitting a low concentration of (X) while at the same time giving a satisfactory sensible object. This is particularly advantageous when (X) is obtained through inefficient two-photon absorption processes. This is diagrammed as in the following Formula. Here (L) is a receptor system.

$$1_X \xrightarrow{h\nu_3} X^* \qquad \text{Formula 10}$$

$$X^* + L \longrightarrow X + L^*$$

$$L^* \longrightarrow \text{sensible object element}$$

Examples of such sensitizing and amplification systems are the following.

(1) A dye precursor in a clear matrix is exposed to two intersecting beams of light of appropriate frequency and intensity such that two photon absorption occurs at the beam intersection, resulting in dye formation. This dye has the ability to photosensitize (T - T energy transfer) the decomposition of the dye precursor via one-photon reaction resulting from absorption of the long wavelength scanning beams or of a separate developing beam. This is shown in Formula 11:

$$A \xrightarrow{h\nu_1 - h\nu_2} A^* \longrightarrow B \qquad \text{Formula 11}$$

$$B \xrightarrow{h\nu_3} B^*$$

$$B^* + A \longrightarrow A^* + B$$

$$A^* \longrightarrow B \text{ (here A is the dye precursor and B is the dye)} \qquad \text{Formula 11}$$

One such system can be prepared in a transparent matrix containing amines, such as diphenylzmine or N-vinylcarbazole together with an organic halide, such as iodoform or carbon tetrabromide. The halide and amine will combine to form a complex which when exposed to the intense pulse of a ruby laser beam intersection forms a small quantity of dye. The amount of dye in the image region can be increased or developed out using red light.

(2) Stable fluorescers can also be generated via simultaneous two-photon absorption systems using the fluorescer precursers listed on pages 389–410, volume 33 of the Journal of Pure and Applied Chemistry. Many light activated generating reactions are available, such as oxidative cyclization, dedimerization, tautomerization, rearrangement, elimination, oxidation, addition, substitution, reduction, etc.

In another variation of the above, the final product (X) may be a photocatalyst. A photocatalyst is distinguished from an energy transfer agent by the fact that it is consumed in the subsequent figure formation reactions. These are diagrammed thus, and examples follow the formula.

$$1_B \xrightarrow{h\nu_1 + h\nu_2} B^* \longrightarrow E \qquad \text{Formula 12}$$

$$E \xrightarrow{h\nu_3} \text{(sensible object formed by blanket irratiation of E)}$$

(1) A compound (A) which can generate a polymerization catalyst (B) via a photoreaction is dissolved in a suitable monomer or crosslinkable polymer. Two photon absorption using intersecting beams is used to generate the active photocatalyst (B) in the desired configuration. The matrix is then exposed to some form of radiation which activates the catalyst (B), but not (A). Compound (A) may also be a polymerization catalyst which has been chemically altered or complexed such that the inactivation can be reversed via two-photon absorption and the original properties restored.

(3) This operation is also suitable using certain dyes which are capable of initiating polymerization only when they are bound to macromolecular substrates. A gel containing crystal violet leuconitrile, monomer, difunctional monomer, a mild reducing agent, and polymethylacrylic acid is exposed, as in example 4. The dye cation generated by two-photon absorption binds to the polymer. The gel is then blanket exposed to radiation in the absorption band of the dye, which becomes reduced, generating radicals to polymerize the monomer. In this way the inefficiency of the two-photon absorption process is overcome using the light "development" of the weak image. This amplification effect has an additional advantage where the intersection region is unfocused or where the beams are spread into more diffuse geometry than narrow pencil beams. For example, where three planes of light are used in generating the active region, defining by their intersection a single point comprising an active region contingent on the presence of all three planar beams. Such a system makes possible a simplification of the beam control devices, although other parts of the system become more complex.

Class II systems: Sequential Absorption Systems

The new Class II systems of this invention are divided into two groups. In Group 1, the secondary beam is absorbed by a molecule in an excited state produced by the previous absorption of the primary beam. In Group 2, the molecule absorbing the secondary photon will have returned after excitation by the primary beam to a new ground state different from the first ground state.

Class II, Group 1

In the following systems the primary beam acts to convert a molecule to an excited state which is capable of further absorption of radiation of the secondary beam. The molecule unexcited by the primary beam remains unabsorptive of the secondary beam radiation. Once reaching the higher excited state, the molecule may rearrange, dissociate, form a radical, transfer its energy to an acceptor system, or otherwise react. In the absence of the secondary beam the excited molecule will not follow any of these paths, but simply decay back to the ground state from which it had been aroused by the primary beam, eliminating any beam path traces.

Unlike the previously disclosed materials in which molecular migration is required, or the photochromic media in which heat or light may be required to produce rapid reversal, the present monomolecular materials have the advantage that they are less effected by the ambient conditions and, since they are monomolecular materials have the advantage that they are less affected by the ambient conditions and, since they are monomolecular receptors, they are freely used in highly viscous or solid media. Another advantage is that they can be selected to have a reversal rate matched to the intensity of the generating beams and the speed of operation. Another important advantage is provided by the increased range of effects characterizing the active region. The known media depend on heat formation in the active region to generate the sensible object as shown in table numbers 20 and 21 of U.S. Pat. No. 4,041,476. The new media of the present invention provide free radicals, direct energy transfer, and other means which greatly improve the resolution and workability of the media.

The higher excited state or its precursors may be a higher vibrational, rotational and/or electronic state. The transition from precursor to the desired excited state must take place before vibrational or electronic relaxation or transfer of excitation energy to surrounding molecules can occur. In some cases this will require the use of high intensity or pulsed laser sources.

There are three fundamental types of reaction falling under the classification of Class II, Group 1 sequential two-photon excited state intermediate reactions.

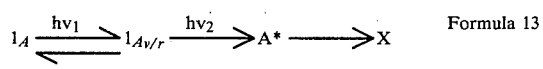

Formula 13

In the above mechanism the energy requirement to reach the state $1_{Av/r}$ is relatively low, and as a result, it is practical to use a wavelength in the lower or infrared energy region for ($hv_1$). One example of this process is obtained by irradiating gaseous HC1 with a primary beam at wavelength 11900 Å to raise the HC1 molecules along the beam path to the third vibrational level. Intersecting this path with a secondary beam at 2650 Å produces luminescence. The secondary beam raises the molecules to the required higher energy level only in the intersection region because it is absorbed only there ... molecules not previously raised to the intermediate level by the infrared radiation of the primary beam will not absorb the selected frequency radiation of the secondary beam. More examples of this type of effect which can be adapted to use in this invention are found in the article by V. S. Letokhov, "Use of Lasers to Control Selective Chemical Reactions", Science, Vol. 180, 1973, pp. 451–458.

The second type of sequential two-photon excited state intermediate reaction type is diagrammed thus:

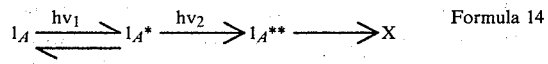

Formula 14

An example of such a reaction sequence occurs when an azulene solution is illuminated with a primary beam of wavelength 5300 Å and a secondary beam of wavelength 10600 Å. The primary beam raises the azulene molecules along its path to an excited vibrational level of the lowest singlet $S_1$. If not further stimulated, these molecules return to the ground state without fluorescing. At the intersection region, where the two beams act sequentially, the molecules in the $S_1$ excited state are raised to the $S_x$ state by the secondary beam, and then fluorescence emission occurs.

The third basic sequential two-photon on excited state intermediate reaction is:

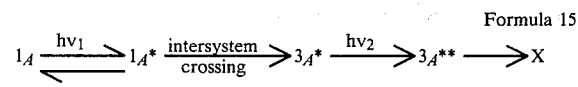

Formula 15

In this case a molecule capable of absorbing energy of appropriate wavelength forms an excited singlet which then undergoes intersystem crossing to form the triplet state. These triplets are incapable of forming radicals or undergoing figure-producing reactions and soon decay into the ground state if they are not further stimulated. However, if they are exposed to radiation of appropriate frequency, they are capable of forming excited triplets which are highly reactive and capable of the various desired reactions. In using this system the primary beam generates triplets along its path and the secondary beam raises the triplets to excited triplets at the intersection.

The use of sensitizers in the active media can reduce the formation of spurious excited triplets in the primary beam path. This could occur when there is overlap between the ground state-singlet and triplet-triplet absorption bands. The sensitizer absorbs the primary beam and generates the desired triplet via triplet-triplet energy transfer. By using a sensitizer and a primary beam of $hv_3$, excited triplet formation will be better localized in the intersection region as shown in FIG. 9.

Using sensitizers can also reduce primary beam attenuation since they can be used in low concentrations. They may also be used to increase the yield of triplets. Examples of these systems are as follows.

(1) Tetramethylphenylenediamine in an EPA matrix at 77° K., when exposed to two intersecting beams of wavelengths 3400 Å and 4000 Å, forms the TMPD radical cation at the beam path intersection, which has a blue color. This reaction will also occur in other solvents, such as methyl alcohol and propylene carbonate. The radical cation may be used in visual display or to catalyze polymerization. Other similar systems can be prepared using triphenylene, 3, 4-benzopyrene, diphenyl or other aromatics in boric acid glass.

(2) Beta-naphthol exposed in a polymethylmethacrylate matrix to two beams matched to the singlet band and to the triplet band of absorption will form a semi-stable yellow radical at the beam path intersection.

(3) Naphthalene dissolved in a solution of monomer, difunctional monomer (to effect crosslinking), and ethyl iodide is exposed to two beams of light, 3130 Å and to a beam of visible light of wavelength absorbed by the triplet of naphthalene. The resulting excited triplet generates radicals which directly or indirectly polymerize and crosslink the monomer. Other compounds which can be used in place of naphthalene to generate similar radicals are acridan, 9-phenylacridan, toluene, naphthol, acriflavine, and acridine.

(4) Orotic acid and similar compounds also form excited triplets via the biphotonic process. This triplet can abstract hydrogen atoms from suitable donors forming a radical which is a potent polymerization and possible crosslinking catalyst.

(5) Benzoyl and oxalyl chloride and benzophenone dissolved in a polymer form an excited state which renders the polymer crosslinked and insoluble via a similar biphotonic mechanism.

As mentioned previously, media utilizing sequential two-photon excited state intermediates can often advantageously incorporate sensitizers. In one group of such sensitized reactions the sensitizer absorbs the primary beam, and the energy is transferred to a ground state molecule as shown in these formula:

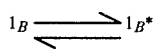

Formula 16

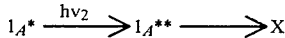

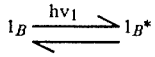

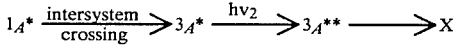

In both of the above systems sensitization is by singlet-singlet interaction or absorption of fluorescence emission. Although there is little theoretical knowledge of the details of these energy transfer mechanisms, for the present purposes practical experience has shown that it is only necessary that the emission spectrum of the donor and the absorption spectrum of the acceptor overlap. The light used need only be of the wavelength absorbed by the sensitizer; the acceptor can be entirely transparent.

Formula 18 shows triplet-triplet sensitization, where, as above, energy is transferred to a ground state molecule.

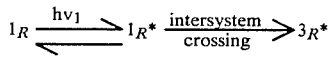

Formula 18

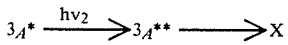

An example following the mechanism of Formula 18 can be prepared by adding benzophenone sensitizer to the system described in example 3, then changing the wavelength of the primary beam to 3650 Å, a wavelength which is not absorbed by the naphthalene alone.

In the following systems (Formulas 19 and 20) the secondary beam is absorbed by the sensitizer and energy transferred to the product of the primary beam. In Formula 19, the sensitizer transfers its energy to the excited singlet, while in Formula 20, the energy is transferred to an excited triplet.

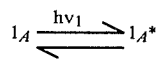

Formula 19

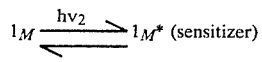

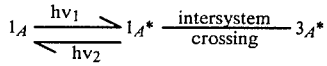

Formula 20

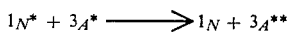

Class II, Group 2

In the above described new Class II, Group 1 systems, the secondary beam absorption was by a molecule in an excited state, and a distinction was made between singlet and triplet excited states. In the present Group 2 systems, because the secondary beam absorber is in the ground state, this distinction is not important and in the following section an intermediate in the excited state may be either a singlet or a triplet.

Group 2 ground state intermediate systems can be prepared in which one or both of the reactions is irreversible. For example:

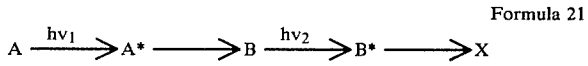

Formula 21

An example of such a reaction is undergone by a trimethine cyanine dye which under (hv$_1$) produces a mono cis isomer sensitive to (hv$_2$), giving a colored di cis isomer. In a similar system rose bengal is incorporated and converted to a de-iodinated derivative by (hv$_1$), which in turn is converted to fluorescein by action of (hv$_2$), providing a colored fluorescent compound and polymerization catalyst. However, these non-reversible systems are useful only for a limited group of simplet figures.

A much more useful reversible sequential two-photon reaction using the ground state intermediate is shown in Formula 22.

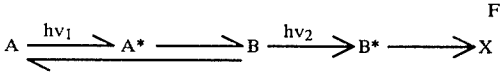

Formula 22

In this case, absorption of the (hv$_1$) photon by component (A) causes the transformation to component (B). Absorption of the secondary photon (hv$_2$) by B will generate a radical or colored compound or energy transfer agent, etc., as described earlier. In those regions not affected by ($hv_2$) compound B will decay back to A. This decay can be accomplished by absorption of light or heat energy, and it can be accelerated by suitable irradiation if the desired reversal rate and population yield are not obtained with simple ambient heat and light. Examples of such systems are the following.

(1) O-methyl and o-benzophenones which reversibly photoenolize upon absorption of ultraviolet light are suitable materials. These enols, upon being irradiated with a blue ($hv_2$), react to form semi-stable cyclic compounds with yellow color.

(2) Similar reactions can be obtained using 2-benzhydryl-3-benzoylchromone and its analogues. Also the dihydrobenzofurnas can be utilized by exploiting photochemical ring opening in combination with photocyclization.

(3) Another such system utilizes isoxazole, which converts to azirine with ($hv_1$), is reconverted to isoxazole by ($hv_2$), and by irradiation with ($hv_3$) yields oxazole from the intermediate azirine.

(4) Another reversible group 2 system can be prepared using C-nitroso compounds which form stable dimers in aqueous and organic solvents. These dimers can be dissociated to monomers using either heat or ultraviolet light as shown in Formula 23.

Formula 23

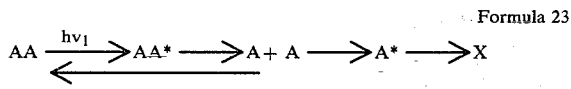

In this system the lifetime of the monomer is dependent on the particular nitroso compound and the choice of solvent and temperature. The monomer, as opposed to the dimer, has an absorption band in the visible red. Light absorbed by this band photolyzes the monomer, producing radicals. Certain dinitroso compounds, such as 1,4-dichloro-1, 4-dinitroso-cyclohexane can be used in a similar way.

In variations of the method, colored compounds can be obtained if the radicals are trapped by color-forming compounds added to the medium, and sensitizers can be employed as has been described for group 1 mechanisms.

(5) Another variation of the mechanism shown in Formula 22 is the following:

Formula 24

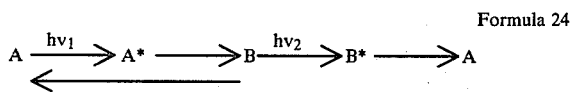

In this case, the product from A with ($hv_1$) is converted back by ($hv_2$) to A. This corresponds to example 2 in U.S. Pat. No. 4,041,476, and applies generally to photochromics in which the spontaneous decay reaction of B to A is slower than the reversion of B to A in selected regions under ($hv_2$). Other suitable photochromics include 6,6'-diethoxythioindigo dyes and derivatives, which can be optically switched between the cis and trans states using two wavelengths $hv_1$ and $hv_2$. The two isomers have different colors and properties, including the fact that only the trans isomer fluoresces. An advantage of these materials is a greatly increased quantum yield at high temperatures (90° in some epoxy resins) which provides for stability at lower temperatures after forming an image at a higher temperature.

(6) Also suitable for this operation are the epoxides described in U.S. Pat. No. 3,329,502. These compounds are thermally stable and can be switched between colorless or light yellow to red.

(7) Similarly N,N'-diacetylindigo dissolved in xylene and molten polyvinyl acetate after cooling gives a very stiff polymer solution which on exposure to blue (4580 Å) turns to the magenta-colored trans configuration. Figures can be constructed with another beam of 5700 Å using the technique of U.S. Pat. No. 3,609,707. The reverse change (an orange figure) can also be prepared using the radiations in reverse order.

Construction of Complex Three-Dimensional Structures Having Multiple Components

In the previous examples a variety of media in solid, liquid, and gaseous states are used in interaction with controlled placement of energy level changes for the production of a range of useful three-dimensionally patterned products. In most cases the emphasis previously has been on the attainment of structural complexity and precision. Thus, products have been described comprising photoresist plastic structures suitable for use as models or mandrels in subsequent fabrication of molds and dies.

The previously generally preferred stabilized or solid media are not suitable for the production of products with a material complexity above a certain level. Thus, in the following examples we have used gaseous and liquid physical states which permit increased complexity of product by virtue of their transportive capability. By the present invention the product is produced within a bath of sustaining medium which may contain, or to which may be introduced, a variety of materials which can be ordered into very complex physical and chemical structures by the appropriate controlled reactivity to controlled energy placements. The transportive capability of the sustaining medium, which is generally in liquid or gaseous phase, permits the juxtaposition of inhomogeneous reaction components so that morphic structures can be constructed. By morphic structures, it is meant structures which have solid, relatively stable physical features. As one example of an application, a three dimensional circuit wiring pattern can be constructed by photodeposition of conductors and semi-conductors in a matrix with an electrically insulative dielectric photochromic reactive product.

The following examples merely illustrate controlled photoreduction of metal and metal oxide in a liquid sustaining medium.

I. Photodeposition of a Metal

1. Titrate 10 ml. of 10% $AgNO_3$ with $NH_4OH$ until initial precipitate is dissolved. Add two drops triethanolamine.

2. Add 3 ml. of above solution to test tube A.

3. In test tube B place 6 ml. of solution prepared in (1) and add sufficient methylene blue to make solution of $10^{-3}$ M.

4. Pour 3 ml. of B solution into test tube C.

5. Place test tubes A and B in sunlight. Keep C in dark.

6. Observe deposition of silver on test tube B and absence of silver deposition on test tubes A and C.

II. Photodeposition of a Metal Oxide

1. Add 2 drops triethanolamine to 10 ml. 10% $CuSO_4$.

2. Place 3 ml. of solution from (1) in tube A.

3. Place 6 ml. of solution from (1) in tube B, then add methylene blue to make $10^{-2}$ M.

4. Place 3 ml. of solution from tube B into tube C.

5. Place test tubes A and B in sunlight. Keep C in dark.

6. Observe precipitation of copper oxide in test tube B, and absence of copper oxide precipitation in test tubes A and C.

A complex of copper, or use of a soluble copper salt, may be resorted to should deposition of metallic copper be desired.

Proposed Theoretical Explanation

Photoreduced dyes are strong reducing agents and can reduce many inorganic compounds. The leuco, or reduced form of the dye, may have a reduction potential as strong as 1.2 volt. Dyes, such as proflavine, methylene blue, acriflavine, and erythrosine, in the presence of certain reducing/chelating agents, such as o-phenanthroline, ethylenediaminetetracetic acid and the salts, triethanolamine, and the like, are reduced to the leuco form on being illuminated, but are not so reduced in the dark. The leuco dye so produced is a powerful reducing agent which acts to reduce metal ions and other substances so as to produce deposition and precipitation, and the like. It is a requirement in these systems that neither the reducing/chelating agent nor the dye be capable of reducing the substances in the dark.

The use of such reactions in the production of patterns using single-photon interactions is carried out according to the method described in U.S. Pat. No. 4,041,476 issued Aug. 9, 1977.

The operation of such reactions by the use of multi-photon interactions is according to the teachings of the present application.

In particular, materially insubstantial mixtures of potential active media can be mixed in a mutually compatible sustaining or supportive medium, then selectively irradiated by directed beams of electtormagnetic radiation to generate a reaction product of a desired shape and material complexity.

Methods and media have been disclosed for creating three-dimensional images in the form of physical or refractive index inhomogeneities. In particular, methods and media have been disclosed for creating materially substantial three-dimensional objects from insubstantial or amorphous active media in a sustaining or supportive medium. The three-dimensional image may be itself "substantial" in that it is a morphous end product. Or the image may be an "amplifying" agent or a "catalytic" agent which is an intermediate step in production of an end product. The term "energy transfer agent" is used in two special senses herein. In the first sense the term "energy transfer agent" is used to refer to an intermediate image in the sense that the intermediate image is employed to "transfer energy" (stored in the form of the intermediate image) to active media to produce a substantial (i.e., morphic) end product. In the second sense, the term "energy transfer agent" is used to refer to the mechanism by which energy passes from an absorbing species component of the reactive media to a non-absorbing component of the reactive media, which energy alone is not capable of forming a three-dimensional image but which is operable in conjunction with a "sensitizer" to generate an image.

The invention has now been explained with reference to particular embodiments and examples. Further obvious embodiments and examples will be suggested to those of ordinary skill in the art by this disclosure. It is therefore not intended that this invention be limited except as indicated by the appended claims.

What is claimed is:

1. A method for generating a substantially persistent three-dimensional inhomogeneity pattern in active media dispersed in a volume of sustaining fluid medium, in response to energy level changes stimulated by directed electromagnetic energy input, said method comprising the steps of:

generating control signals specifying fixed relative coordinate positions within said volume;

directing electromagnetic energy into said volume to cause energy level changes within molecules of said active media at said coordinate positions corresponding to said three-dimensional pattern, said molecules being an agent capable of receiving energy from a source external to said volume and transferring energy so as to create change in the physio-chemical behavior state of said active media; and stimulating said molecule to effect an intramolecular radiationless transition not depending on 1/rq to produce a reaction generating said three-dimensional pattern.

2. A method of pattern generation according to claim 1, wherein said energy transfer agent photosensitizes said active media for decomposition by triplet-triplet energy transfer through a one-photon reaction resulting from absorption of an electromagnetic beam.

3. A method for generating a substantially persistent three-dimensional inhomogeneity pattern in active media dispersed in a volume of a sustaining fluid medium substantially transparent to electromagnetic radiation in first selected absorption spectra of said active media, said method comprising the steps of:

directing to selected locations within said fluid medium a first beam of electromagnetic radiation matched to absorption characteristics of first state properties of said active media to establish a changed physio-chemical state in said active media; and directing a second beam of electromagnetic radiation to intersect at least a portion of said selected locations, said second beam of radiation being matched to absorption characteristics of said changed state properties of said active media, such that said active media exhibits substantially changed electromagnetic mono molecular absorption relative to said first state confined to the region of beam intersection.

4. A method as in claim 3, in which changed absorption occurs via triplet-triplet energy transfer.

5. A method as in claim 3 further including sensitizers which increase attenuation of said second beam.

6. A method as in claim 3 further including sensitizers which reduce attenuation of said second beam.

7. A method as in claim 3 further including sensitizers which increase the yield of triplet-triplet energy transfer.

8. A method as in claim 3 further including sensitizers which reduce formation of spurious excited triplets in the first beam path due to overlap between ground-state singlet and triplet-triplet absorption bands.

9. A method as in claim 3, in which said active media participate in the following reaction sequence:

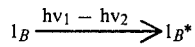

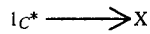

10. A method as in claim 3 further including sensitizers which utilize singlet-singlet interaction.

11. A method as in claim 3 further including sensitizers which utilize fluorescence for energy transfer.

12. A method as in claim 3, in which the active media participate in the following reaction sequence:

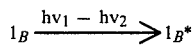

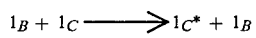

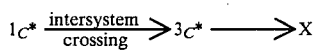

13. A method as in claim 12 further including sensitizers which utilize singlet reactions.

14. A method as in claim 3, in which the active media participate in the following reaction sequence:

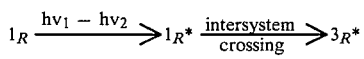

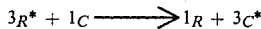

15. A method as in claim 14 further including sensitizers which utilize triplet reactions.

16. A method as in claim 3, in which said active media participate in the following reaction sequence:

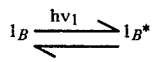

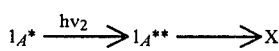

17. A method as in claim 3 further including sensitizers whereby energy is transferred to a ground-state molecule.

18. A method as in claim 17, in which the ground-state molecule is relatively less absorptive of the first beam than are the sensitizers.

19. A method as in claim 3, in which the active media participate in the following reaction sequence:

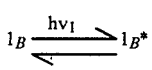

-continued

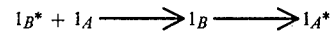

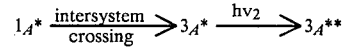

20. A method as in claim 3, in which the active media participate in the following reaction sequence:

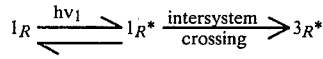

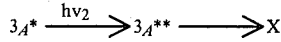

21. A method as in claim 20 further including sensitizers, and in which the ground-state molecule is relatively less absorptive of the first beam designated $hv_1$ than are the sensitizers.

22. A method as in claim 3, in which said sensitizers participate in the following reaction sequence:

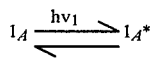

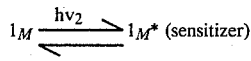

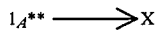

23. A method as in claim 22, in which the componen designated $1_A$ is relatively less absorptive of the beam designated $hv_2$ than are the sensitizers.

24. A method as in claim 3, in which the sensitizers participate in the following reaction sequence:

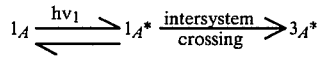

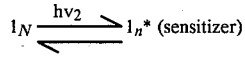

25. A method as in claim 24, further including sensitizers, and in which the sensitizers are relatively less absorptive of the first beam designated $hv_1$ than is the component designated $1_A$.

26. A method as in claim 24, in which the component designated $1_A$ is relatively less absorptive of the beam designated $hv_2$ than are the sensitizers.

27. A method as in claim 3 further including sensitizers which transfer energy to an excited triplet.

* * * * *